United States Patent [19]

Chen

[11] Patent Number: 5,650,747

[45] Date of Patent: Jul. 22, 1997

[54] CIRCUIT TECHNIQUE FOR IMPLEMENTING PROGRAMMABLE ZEROS IN HIGH SPEED CMOS FILTERS

[76] Inventor: Xiaole Chen, 810 Erie Cir., Milpitas, Calif. 95035

[21] Appl. No.: 539,573

[22] Filed: Oct. 5, 1995

[51] Int. Cl.[6] ........................................................ H03F 3/45
[52] U.S. Cl. .......................... 327/552; 327/562; 327/103; 330/254; 330/303
[58] Field of Search ................... 327/560–563, 327/103, 551–553, 557–559; 330/304, 305, 254, 301, 303, 306

[56] References Cited

U.S. PATENT DOCUMENTS

| | | | |
|---|---|---|---|
| 5,115,152 | 5/1992 | Nishimura | 327/561 |
| 5,182,477 | 1/1993 | Yamasaki et al. | 330/306 |
| 5,235,540 | 8/1993 | De Veirman | 364/825 |
| 5,311,088 | 5/1994 | Nelson | 327/552 |
| 5,440,264 | 8/1995 | Sevenhans et al. | 330/305 |
| 5,525,928 | 6/1996 | Asakawa | 327/552 |
| 5,528,179 | 6/1996 | Siniscalchi et al. | 327/560 |

FOREIGN PATENT DOCUMENTS 2-276467   11/1990   Japan .

OTHER PUBLICATIONS

Umezawa et al., "A 5-V-Only Operation 0.6-μm Flash EEPROM with Row Decoder Scheme in Triple-Well Structure", *IEEE Journal of Solid-State Circuits*, vol. 27, No. 11, Nov. 1992, pp. 1540–1546.

*Primary Examiner*—Timothy P. Callahan
*Assistant Examiner*—T. Lam

[57] ABSTRACT

A circuit technique for implementing programmable zeros in high speed CMOS filters is disclosed. The circuit uses both PMOS and NMOS type transconductance elements to implement a biquad with a real zero and two complex poles. The NMOS transconductance element is biased by the total bias current required by several PMOS transconductance elements and can thus provide larger transconductance as required by the equalization function. Programmability is achieved by dividing the NMOS transconductance elements into a plurality of identical sub-elements that are connected in parallel via digitally programmable switches.

17 Claims, 2 Drawing Sheets

CIRCUIT TECHNIQUE FOR IMPLEMENTING PROGRAMMABLE ZEROS IN HIGH SPEED CMOS FILTERS

This invention is related to commonly-assigned U.S. patent application Ser. No. 08/453,413, (atty Dckt No. 10262-58), entitled "Improved Transconductance Element for High Speed Gm-C Integrated Filters."

BACKGROUND OF THE INVENTION

The present invention relates in general to complementary metal-oxide-silicon (CMOS) filters, and in particular to a circuit technique to implement programmable zeros in high speed CMOS filters.

The major technical challenge to implement a filter with equalization function using CMOS technology is the considerably lower transconductance for MOS transistors compared to their bipolar counterparts. The circuit techniques used in BiCMOS process are not applicable to the CMOS process. To implement two real zeros using CMOS technology, the general approach is to sum or subtract the band-pass output from the low-pass output of a preceding biquad stage.

FIG. 1 shows a block diagram of a 7-pole 2-zero filter/equalizer. It consists of three biquads 100, 102, and 104, and a monoquad 106. Each biquad generates a low-pass output $v_o$, and a band-pass output $v_b$. The last block 106 has two identical monoquads connected in parallel to the low-pass output and the band-pass output of the third biquad to provide a real pole. Each of the second and the third biquads generates a real zero in addition to two complex poles to provide both magnitude and group delay equalization. The magnitude equalization is realized by moving the real zeros from infinite to finite values on the real axes. The group delay equalization is implemented by programming the two real zeros non-symmetrically about the origin of S-plane.

FIG. 2 shows a block diagram of a typical transconductor-based biquad to implement the second biquad 102. The biquad 102 includes two integration stages 200 and 202. The first integration stage 200 includes a feedback transconductance element $-g_m$, a band-pass input-controlled transconductance element $-k_1 g_m$, and a low-pass input-controlled transconductance element $g_m$. Capacitors C1 and C2 are the integration capacitors, and damping transconductor $g_d$ provides the required damping effect. The first integration stage 200 receives the low-pass output $v_{o1}$ and the band-pass output $v_{b1}$ from the previous biquad (100). A zero is realized by summing the band-pass output and the low-pass output of the first biquad 100 in the form of current at node $v_{b2}$. Compared to the standard 2-pole biquad, one extra transconductor is needed to implement the second biquad 102. The position of the zero which corresponds to the magnitude and group delay equalization can be changed by varying the coefficient $k_1$. To achieve a maximum magnitude equalization of, for example, 6.5 dB at the corner frequency of the filter, $k_1$ would have to equal approximately 2.137, a relatively large multiplier factor.

Designing a circuit that implements such a transconductor in the biquad poses several challenges. Integrated circuit implementations of filters typically use the same type of transconductors for all of the transconductance elements including the zero-implementing (equalization) transconductor. This approach results in a large parasitic capacitance at the band-pass output node as compared to the low-pass output node. To alleviate this problem, a separate summing stage is often used to implement the zero. However, the summing stage in this approach introduces an extra pole in the signal path which causes phase lag error. Moreover, power consumption is usually increased significantly because the transconductor required to implement the equalization function is much larger than the other transconductors of the biquad. That is, to obtain a large value for $-k_1 g_m$, larger transistor sizes or larger currents are required. This also adds to the circuit size and thus cost of manufacture.

There is therefore a need for a circuit technique that efficiently implements programmable zeros in CMOS filters with reduced parasitics, power consumption and circuit size.

SUMMARY OF THE INVENTION

The present invention provides a novel circuit technique to implement programmable zeros in CMOS filters with minimum increased power consumption and no additional node introduced in the signal path. Broadly, the circuit of this invention combines complementary transconductance elements in a novel configuration inside the first integration stage of a biquad to realize zeros. The first integration stage includes parallel-connected PMOS transconductance elements that receive the low-pass input signal and the low-pass feedback signal, and an NMOS transconductance element connected in series with the PMOS transconductance elements, that receives the band-pass input signal. While all of the transconductance elements (NMOS and PMOS) are functionally parallel to each other, the physically serial connection of the NMOS transconductance element allows it to be biased using the current required by the PMOS transconductance elements. The inherently larger NMOS transconductance and the higher bias current result in a high overall transconductance. Programmability is achieved by providing multiple parallel-connected zero-implementing NMOS transconductance elements that are activated by digital control bits.

Accordingly, in one embodiment, the present invention provides an integration stage for use in integrated circuit filters, which includes a first transconductance element of a first type for receiving a low-pass input signal, a second transconductance element of the first type coupled to the first transconductance element for receiving a low-pass feedback signal, and a third transconductance element of a second type coupled to the first and the second transconductance elements, for receiving a band-pass input signal. The first and the second transconductance elements are PMOS type transistors, while the third transconductance element is NMOS type transistor. The third transconductance element is divided into a plurality of identical units that are coupled in parallel. Digitally controlled switches couple the units in and out of the circuit to obtain variable transconductance values to program the equalization (location of the zeros).

A better understanding of the nature and advantages of the present invention may be had with reference to the diagrams and detailed description below.

DESCRIPTION OF THE PREFERRED EMBODIMENT

Figure 1:
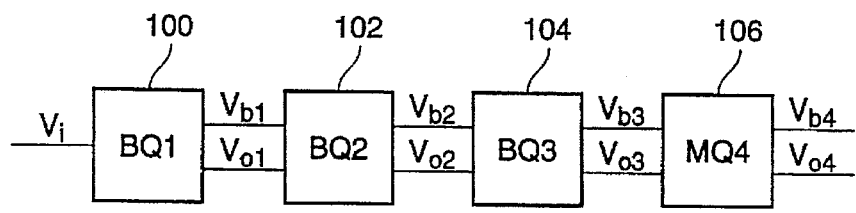
FIG. 1 is a block diagram of a 7-pole, 2-zero filter/equalizer.
Figure 2:
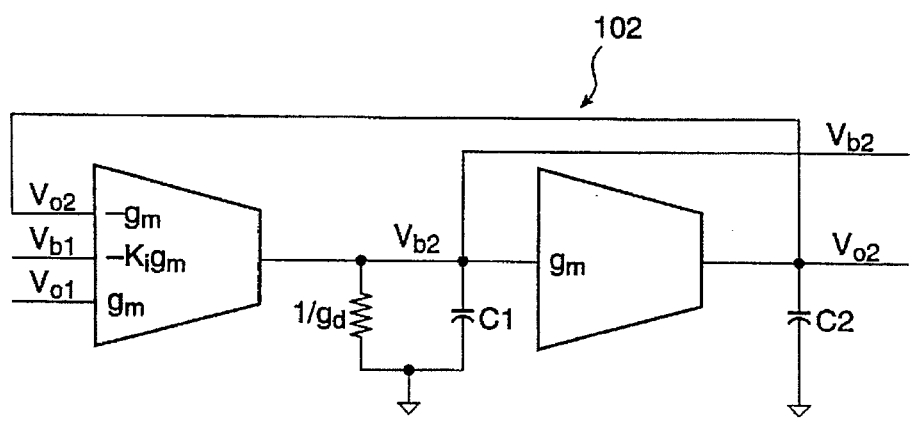
FIG. 2 is a block diagram of a biquad section used as the second or third stage of the filter of FIG. 1.
Figure 3A:
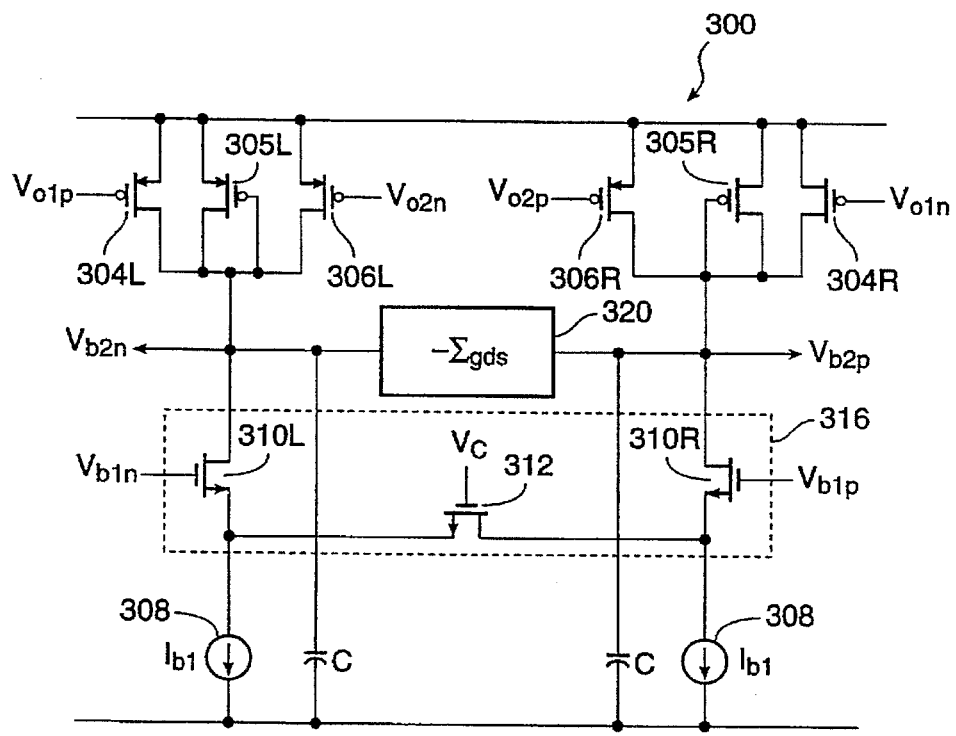
FIGS. 3a and 3b show schematics of the first and the second integration stages of the biquad section of FIG. 2, respectively.
Figure 3B:
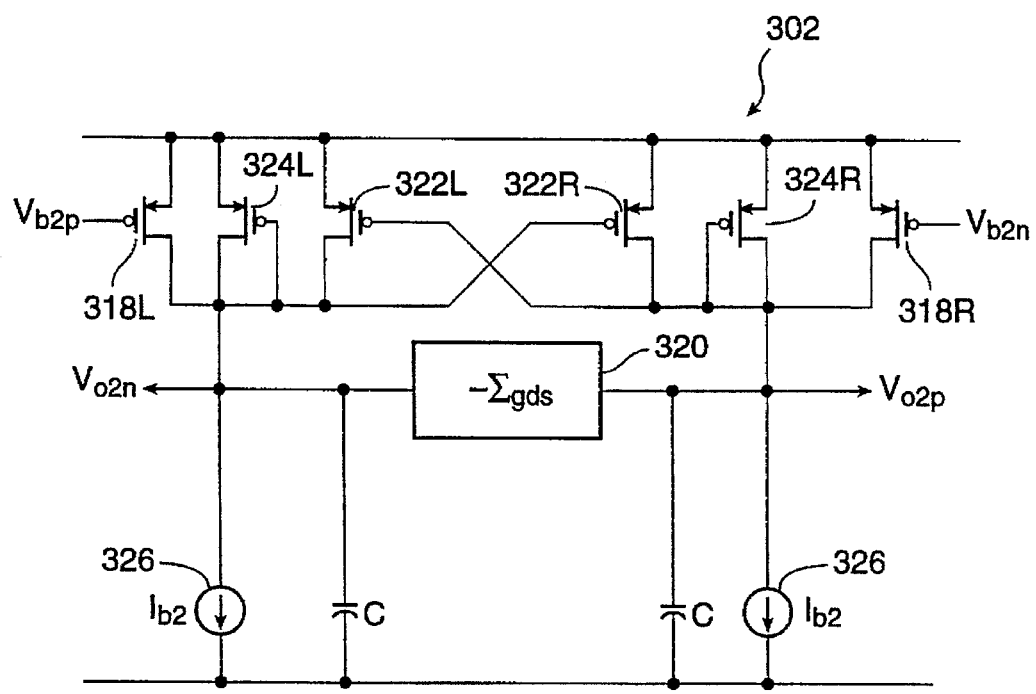

Referring to FIGS. 3a and 3b, there is shown a circuit implementation of the first and second integration stages of a mid-section biquad of the 7-pole, 2-zero fully differential filter/equalizer of FIG. 1. The first and second integration stages 300 and 302 include transconductors that are a modification of the standard inverter-based transconductor (where the NMOS transistors are replaced with bias current sources). The transconductors required to implement the poles in the first integration stage 300 are realized by PMOS transconductors 304R and 304L receiving the differential low-pass input signal $v_{o1n}$ and $v_{o1p}$ (from the preceding biquad section), and 306L and 306R receiving the differential low-pass feedback signal $v_{o2n}$ and $v_{o2p}$. The damping tranconductance $g_d$ (in FIG. 2) is realized here by the addition of diode-connected PMOS transistors 305L and 305R. Current source devices 308 supply the bias current $I_{b1}$ for the PMOS transconductor elements.

As fully described in the above-mentioned commonly assigned, related U.S. Pat. No. 5,570,049, compensation transconductors 320 connect at the output of each stage to compensate for the finite output conductance of the transistor. The compensation transconductors 320 provide a transconductance value that is equal to the sum of the output conductances of all of the $g_m$ cells. This value is then subtracted from the integrator total output conductance. This maximizes the integrator's differential output impedance, and improves the overall performance of the filter.

The circuit of the present invention implements zeros by adding a fourth transconductor element 316 which uses NMOS transistors. The transconductor element 316 includes NMOS transistors 310L and 310R inserted between the PMOS transconductors and the current source devices, and an NMOS tuning transistor 312 connected between the two NMOS transistors 310L and 310R. The NMOS transistors 310L and 310R receive the differential band-pass signal $v_{b1n}$ and $v_{b1p}$ from the preceding biquad.

The transconductance of the PMOS transconductors 304 and 306 is adjusted by the bias current $I_{b1}$ which is controlled by a separate transconductance setting circuit (not shown). Based on the bias current $I_{b1}$, another transconductance setting circuit (not shown) is used to set the DC control voltage $v_c$ supplied to the gate terminal of NMOS tuning transistor 312. NMOS transistor 312 controls the effective value of transconductance for the third NMOS transconductor 316.

Accordingly, this circuit uses the bias current required by three PMOS transconductors (304, 305, and 306) to bias the NMOS transconductor 316. Thus, without increasing power consumption, large transconductance can be obtained from the inherently stronger NMOS transistors 310L and 310R. Another advantage of using this approach is that the noise level of the circuit is not increased because only one extra device, NMOS 312, is added in the signal path which contributes negligible noise.

FIG. 3b is the circuit schematic for the second integration stage 302 of the biquad 102. The circuit includes differential PMOS transconductors 318R and 318L that receive the differential band-pass signals $v_{b2n}$ and $v_{b2p}$ generated at the output of the first integration stage 300. Cross-coupled PMOS transistors 322L and 322R, as well as diode-connected PMOS transistors 324L and 324R set the common-mode voltage of the differential output $v_{o2n}$ and $v_{o2p}$. The second integration stage 302 also includes the compensation transconductor 320 to maximize the integrator's differential output impedance. The transconductors of the second stage are biased by current source elements 326 that provide bias current $I_{b2}$.

Programmable equalization is implemented by the first integration stage by dividing the NMOS transconductor 316 into multiple smaller parallel connected transconductors. The NMOS transconductor can be divided into, for example, seven identical parallel connected transistors (310L, 310R, and 312), grouped in sets of, for example, four, two and one. Each set can then be separately switched in and out of the parallel connection by digitally controlled switches or transmission gates.

Figure 4:
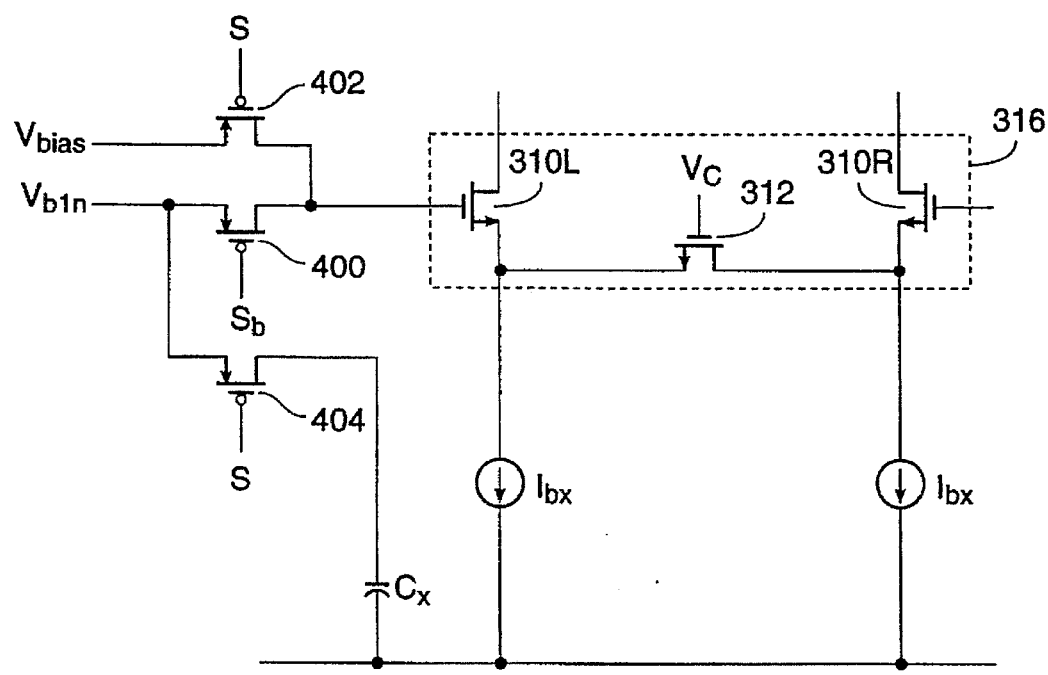
FIG. 4 is a simplified schematic of the equalization control circuit.

FIG. 4 shows a simplified schematic of the equalization control circuitry for a single unit of NMOS transconductor 316. This diagram shows only the control devices for one side of the differential input of one of the multiple transconductors. The control circuit includes a first PMOS switch transistor 400 that connects the gate terminal of NMOS transconductor 310L to the band-pass input signal $v_{b1n}$. A second PMOS switch transistor 402 connects the gate terminal of NMOS 310L to a DC bias voltage $v_{bias}$. A third PMOS switch transistor 404 connects the band-pass input signal $v_{bn}$ to a load capacitor $C_x$. The gate terminals of switches 400, 402 and 404 are controlled by the complementary digital signal s and sb.

In operation, when s is a logic high, PMOS switch transistors 402 and 404 are off and switch 400 is on. The unit of transconductor is thus connected to the band-pass output $v_{bn1}$ of the first (preceding) biquad section. When s is a logic low, switches 402 and 404 are on and switch 400 is off. This connects the transconductor input to the DC bias voltage $v_{bias}$, and the band-pass output of the previous biquad to load capacitor $C_x$. The load capacitor $C_x$ is used to emulate the capacitive loading effect of the transconductor to the band-pass output of the first biquad. Thus, for the example described herein, there will be three control bits required to connect either one of the three units of transconductance (4, 3, or 1) to obtain variable equalization. Each unit will require six switches, three for each side as shown in FIG. 4.

In conclusion the present invention provides a novel circuit technique to implement programmable zeros in CMOS filters with minimum increased power consumption and no additional node introduced in the signal path. While the above is a complete description of a specific embodiment of the present invention, it is possible to use various alternatives, modifications or equivalents. Therefore, the scope of the present invention should be determined not with reference to the above description, but, instead, should be determined with reference to the appended claims and their full scope of equivalents.

What is claimed is:

1. A differential integration stage having a differential output terminal for use in differential filter/equalizer integrated circuits, comprising:

a first differential pair of PMOS transconductors coupled between a source voltage and the differential output terminal, respectively, the first differential pair of PMOS transconductors receiving a differential low-pass input signal, respectively;

a second differential pair of PMOS transconductors coupled between the source voltage and the differential output terminal, respectively, the second differential pair of PMOS transconductors receiving a differential low-pass feedback signal, respectively;

an NMOS transconductance element including first and second NMOS transconductors coupled to the differential output terminal and receiving a differential bandpass signal, respectively, and an NMOS transconductance tuning transistor coupled between the first pair of NMOS transconductors; and first and second current source devices respectively coupled to said first and second NMOS transconductors, said first and second current source devices providing bias current for the integration stage, wherein, a bias current through the first differential pair of PMOS transconductors and a bias current through said second differential pair of PMOS transconductors combine to provide a bias current for the first and second NMOS transconductors.

2. The integration stage of claim 1 further comprising a differential pair of diode-connected PMOS transconductors coupled between the source voltage and the differential output terminal, respectively, wherein a bias current through the differential pair of diode-connected PMOS transconductors also feeds the first and second NMOS transconductors.

3. The integration stage of claim 2 wherein the NMOS transconductance element is divided into a plurality of identical sub-elements, coupled in parallel via digitally controlled switches.

4. A differential transconductance element comprising:

a differential transconductor of a first type having a pair of input terminals coupled to receive a first pair of differential input signals, respectively, and a pair of output terminals;

a differential transconductor of a second type having a pair of input terminals coupled to receive a second pair of differential input signals, respectively, said differential transconductor of the second type being physically coupled in series to said pair of output terminals of said differential transconductor of the first type; and a pair of current source devices coupled to said differential transconductor of the second type, wherein, said pair of current source devices supply bias current to both of said differential transconductors of the first and second type.

5. The differential transconductance element of claim 4 wherein said differential transconductor of the first type comprises a pair of PMOS transistors having their gate terminals respectively coupled to said pair of input terminals of said differential transconductor of the first type, and wherein said differential transconductor of the second type comprises a pair of NMOS transistors having their gate terminals respectively coupled to said pair of input terminals of said differential transconductor of the second type, and a tuning transistor coupled between said pair of NMOS transistors, said tuning transistor having a gate terminal coupled to a control voltage.

6. The differential transconductance element of claim 4 further comprising a differential feedback transconductor of said first type coupled in parallel to said differential transconductor of said first type, said differential transconductor of said first type having a pair of input terminals coupled to receive a pair of differential feedback signals, respectively.

7. The differential transconductance element of claim 4 further comprising a differential damping transconductor of said first type coupled in parallel to said differential transconductor of said first type.

8. The differential transconductance element of claim 4 further comprising an output impedance compensation transconductor coupled to said pair of output terminals.

9. An integration stage for use in integrated circuit filters, comprising:

a first PMOS differential pair transconductor having differential input terminals for receipt of first differential input signals, and differential output terminals coupled to differential output terminals of the integration stage;

an NMOS differential transconductor having differential input terminals for receipt of first differential input signals, and differential output terminals coupled to the differential output terminals of the integration stage to physically couple in series with said first PMOS differential pair transconductor;

first and second integration capacitors respectively coupled to said differential output terminals of the integration stage; and first and second current source devices respectively coupled to each leg of said NMOS differential transconductor, wherein, said first and second current source devices supply bias current to both said first PMOS differential pair transconductor and said NMOS differential transconductor.

10. The integration stage of claim 9 wherein said NMOS differential transconductor comprises a pair of NMOS transistors having their gate terminals coupled to said differential input terminals of said NMOS differential transconductor, their first source/drain terminals coupled to said differential output terminals of the integration stage, and their second source/drain terminals respectively coupled to said first and second current source devices, said NMOS differential pair transconductor further comprising a tuning transistor coupled between the second source/drain terminals of said pair of NMOS transistors.

11. The integration stage of claim 9 further comprising a second PMOS differential pair transconductor coupled in parallel to said first PMOS differential pair transconductor having differential input terminals for receipt of differential feedback signals, and differential output terminals coupled to the differential output terminals of the integrations stage.

12. The integration stage of claim 11 further comprising a third PMOS differential pair transconductor coupled in parallel to said first and second PMOS differential pair transconductors, said third PMOS differential pair transconductor providing a damping effect.

13. The integration stage of claim 12 further comprising an output impedance compensation transconductor coupled between the differential output terminals of the integration stage.

14. The integration stage of claim 13 wherein substantially the same bias current supplied by said first and second current source devices that flows through said NMOS differential transconductor is shared by said first and second and third PMOS differential pair transconductors.

15. The integration stage of claim 9 wherein said NMOS differential transconductor comprises a plurality of NMOS differential sub-transconductors coupled in parallel via digitally programmable switches.

16. The integration stage of claim 12 wherein poles are implemented by said first PMOS differential pair transconductor receiving a differential low-pass input signal at its differential input terminals, and said second PMOS differential pair transconductor receiving a differential low-pass feedback signal at its differential input terminals.

17. The integration stage of claim 16 wherein a zero is implemented by said NMOS differential transconductor receiving a differential band-pass signal at its differential input terminals.

* * * * *